United States Patent [19]

Crawford et al.

[11] 4,387,156
[45] Jun. 7, 1983

[54] IMAGEABLE FILM CONTAINING A METAL OXIDE OPACIFYING LAYER

[75] Inventors: George H. Crawford, White Bear Lake; Richard S. Fisch, St. Paul, both of Minn.

[73] Assignee: Minnesota Mining and Manufacturing Company, St. Paul, Minn.

[21] Appl. No.: 231,031

[22] Filed: Feb. 4, 1981

[51] Int. Cl.$^3$ .................................................. G03C 1/78
[52] U.S. Cl. ...................................... 430/271; 430/178; 430/275; 430/278; 430/279
[58] Field of Search ............... 430/275, 278, 271, 279, 430/178

[56] References Cited

U.S. PATENT DOCUMENTS

| | | | |
|---|---|---|---|
| 3,811,894 | 5/1974 | Yonezawa et al. | 430/278 |
| 3,975,197 | 8/1976 | Mikelsons | 430/278 |
| 4,021,592 | 5/1977 | Fromson | 430/278 |
| 4,292,388 | 9/1981 | Ikeda et al. | 430/278 |
| 4,292,393 | 9/1981 | Wada et al. | 430/25 |

*Primary Examiner*—Jack P. Brammer
*Attorney, Agent, or Firm*—Cruzan Alexander; Donald M. Sell; Mark A. Litman

[57] ABSTRACT

Imaging materials are disclosed which comprise a substrate having a metal/ (metal oxide or sulfide) coating with an optical density of at least 0.2 on one surface of the substrate and a photoresist layer over said coating.

9 Claims, No Drawings

IMAGEABLE FILM CONTAINING A METAL OXIDE OPACIFYING LAYER

TECHNICAL FIELD

The present invention relates to novel structures which are useful as imageable films. These films would be particularly useful in the field of micrographics and graphic arts and comprise a substrate having a layer comprising a dispersion of (1) metal and (2) metal oxide or sulfide and a photoresist composition over said metal layer.

BACKGROUND OF THE ART

Many imageable materials and imaging technologies are commercially available today. The most useful of these technologies tend to have photosensitive capabilities which enable convenient reproduction of images. This is particularly true in the micrographics and graphic arts field.

The most commonly used imaging systems are based on silver halide emulsion technology, diazonium salt technology, or photopolymerizable composition technology. Each of these different systems has its own advantages and problems.

Silver halide films are the most widely used graphic arts material. These films show high resolution, high imaging speeds, and consistency in their performance. However, because of the rising cost of silver, systems using silver halide emulsions are becoming economically disadvantageous. Silver halide films also have other disadvantages including the requirement for multiple steps in processing, unstable processing solutions, and lack of dimensional stability.

Imaging systems using diazonium salt compositions provide high resolution and are considerably less expensive than silver to produce. The visible image produced by most diazonium salt systems consists of a dye and tends to have limits on the maximum optical densities or image color obtainable, higher minimum densities than desirable, and often suffers from a low contrast. Although thermally developable diazonium salt systems are available in the marketplace, many diazonium salt image systems still rely upon ammonia development which is undesirable because of the difficulty of working in a closed environment with ammonia. Often the diazo image comprises a dye and is not considered archival in the micrographic context.

Photopolymeric imaging systems are both inexpensive and easy to make. However, these systems usually depend upon the loading of the photopolymeric layer with opacifying material to provide optical density, which tends to reduce the sensitivity of the photosensitive layer.

One type of system which has recently been introduced to the art comprises a substrate having on at least one surface thereof a roughened metallic layer which is overcoated with a metal or metal alloy layer and subsequently coated with a photosensitive resist composition. This type of technology is exemplified by U.S. Pat. No. 4,138,262 wherein a bismuth layer is sputter deposited upon a substrate and a continuous high optical density layer of bismuth or an alloy of bismuth is vacuum deposited on the sputtered metal layer to provide a highly opaque appearance to the surface. This system is developed in two steps by first imagewise exposing the photoresist layer, then dissolving away the photoresist material in an imagewise manner to expose the underlayers of metal. The exposed metal or metal alloy is etched away in a second step. When viewed from the photoresist side, this provides a black metal image on a clear background. When viewed from the opposite side, this provides a shiny metal layer on a clear background. This system requires two separate metal coating steps and requires two developing solutions, one for the photoresist and the other for the metal or metal alloy opaque layer. The system as disclosed is also limited in the metals that can be used. Other systems which utilize photoresist layers over metal or metallized substrates are disclosed in U.K. Pat. No. 1,468,746 wherein substrates of metal are overcoated with photoresist materials. The film is shown to be particularly desirable for microforming images and shown to have outstanding edge acutance and high resolution. The system will only provide images having substantially pure metal features.

U.S. Pat. Nos. 4,008,084 and 4,158,079 show imaging systems using combinations of metals in different layers or different layers of metals and metal oxides under photoresist compositions. The latter patent in particular shows an imaging system comprising a substrate having respectively on at least one surface an aluminum foil layer, an aluminum oxide layer and a photoresist composition. This material suffers from poor bonding of the aluminum oxide layer to the photopolymer layer which causes separation of those layers during development, particularly by aqueous alkaline developers conventionally used with photoresist materials. The juncture between the metal/metal oxide layer has a sharp, discontinuous transition from metal to metal oxide because of the manner in which it is formed.

U.S. Pat. No. 4,158,079 discloses another imageable composite comprising a substrate, an aluminum foil layer, an aluminum oxide layer and a photoresist layer. The aluminum foil layer is adhered to the substrate by an adhesive and the aluminum oxide layer is produced by anodization of the foil. The optical density of the composite is increased by adding coloring material to the aluminum oxide layer prior to applying the photoresist. This composite has the disadvantage of requiring multiple steps in manufacturing of the substrate (both lamination and anodization) and in the fact that addition of a coloring material to the aluminum oxide layer fills the pores of that layer and reduces the ability of the photoresist layer to bond to that surface.

SUMMARY OF THE INVENTION

The present invention relates to a novel imageable construction comprising a substrate having on at least one surface thereof a layer comprising dispersion of (1) a metal and (2) a metal oxide or sulfide, and a photoresist composition over said layer. These elements can display an excellent cohesion within the metal/(metal oxide or sulfide) layers and a good adhesion to the photoresist layer so that the various portions of these layers do not undesirably separate during development of the photoresist material. These photosensitive elements are further capable of being developed to their final image in a single step.

DETAILED DESCRIPTION OF THE INVENTION

The present invention relates to novel imaging elements which comprise a substrate having on at least one surface thereof a layer having an optical density of at least 0.2 and comprising a dispersion of (1) a metal and (2) a metal oxide or sulfide. The dispersion may be of metal in metal oxide or sulfide, or it may be of metal oxide or sulfide in metal. The layer may be a homogeneous or anisotropic dispersion, with transitions between regions of relatively higher metal/(metal oxide or sulfide) ratios to regions of relatively lower ratios of metal/(metal oxide or sulfide). The graded layer may, in fact, have a transition from essentially pure metal to essentially pure metal oxide or metal sulfide, and the dispersion containing layer may be deposited continuously onto a metal or metallized substrate. The use of the graded layer provides excellent coherence for this optical density providing layer and provides the capability of high optical densities and high contrast between $D_{max}$ and $D_{min}$ areas of the developed film. The term "homogeneous" as used herein refers to the fact that the relative proportions of materials within the layer are fairly constant throughout its thickness even though the materials may be present as dispersed phases.

Previous efforts to produce imageable articles from metal or metallized substrates have encountered a number of difficulties, particularly when using aluminum as the metal. Photoresist materials, both positive acting and negative acting, tend to bond poorly to the metal surface. This poor bonding is most particularly deleterious during development of an image on the article. The developer solutions, which are generally organic solvent containing aqueous alkaline solutions, tend to channel between the metal substrate and the portions of the photoresist layer which are not supposed to be removed by the developer. This causes indescriminate removal of the resist and destruction of the image. Anodization of the metal layer produces a porous metal oxide coating to which the photoresist may adhere well, but this is an expensive and time consuming process. Application of a metal oxide layer by vapor deposition or sputtering produces a smooth layer from which the photoresist is also generally removed by channelling of the developer. It has been found in the practice of the present invention that layers comprised of a dispersion of (1) metal and (2) metal oxides or sulfides provide improved bonding over pure metal and pure metal oxide layers. Additionally, these dispersions are able to provide a range of optical densities to the article. The dispersion of the metal and its oxidized product itself produces the optical density and may provide coloration ranging through pale yellow, tan, gold, gray, purple-black, blue-black and solid black. It has been estimated that there is a sufficient dispersion of the metal in the oxidized metal phase or the oxidized metal in the metal phase when an optical density of at least 0.2 is provided by a surface zone of the dispersion. This may be a reflection or transmission optical density, whichever is most conveniently measured on the article.

The substrate may be substantially any material. Depending upon the use of the product, the selected substrate could be ceramic, glass, metal, polymeric, fibrous, etc. It is preferred to use polymeric materials as the substrate, and the present invention contemplates the use of both transparent and opaque thermoplastic and thermoset films. Thermoplastic materials, and especially biaxially oriented films, are generally preferred because of their greater ability to resist breaking and cracking. Any organic polymeric material including but not limited to polyesters, polyolefins, polycarbonates, polyvinyl resins, polyvinyl acetals, polyamides, polyurethanes, polyepoxides, polysiloxanes, polyacrylates, polymethacrylates, polystyrene, and the like may be used in the practice of the present invention. The main purpose of these films is to provide a support for the final image, and the film does not itself enter into the imaging characteristics or photosensitive properties of the system itself. The support may be as thin or thick as is necessary for support, ranging for example, from 50 micrometers to 2 mm. A preferred range would be from 75 or 100 to 500 micrometers.

The photoresist composition may be any photosensitive resist material known in the art. This includes both positive acting and negative acting photoresist systems. Positive acting photoresist systems ordinarily comprise polymeric binders containing positive acting diazonium salts or resins such as those disclosed, for example, in U.S. Pat. Nos. 3,046,120, 3,469,902, and 3,210,239. The positive acting photosensitizers are commercially available and are well reported in the literature. Negative acting photosensitive resist systems ordinarily comprise a polymerizable composition which polymerizes in an imagewise fashion when irradiated, such as by exposure to light. These compositions are well reported in the literature and are widely commercially available. These compositions ordinarily comprise ethylenically or polyethylenically unsaturated photopolymerizable materials, although photosensitive epoxy systems are also known in the art. Preferably ethylenically unsaturated photopolymerizable systems are used, such as acrylate, methacrylate, acrylamide and allyl systems. Acrylic and methacrylic polymerizable systems are most preferred according to the practice of the present invention. U.S. Pat. Nos. 3,639,185, 4,008,084, 4,138,262, 4,139,391, 4,158,079, 3,469,982, U.K. Pat. No. 1,468,746, as well as the composition disclosed in U.S. patent application Ser. No. 60,601, filed July 27, 1979 now U.S. Pat. No. 4,247,616, disclose photosensitive compositions generally useful in the practice of the present invention. U.S. patent application Ser. No. 146,642, filed May 5, 1980 now U.S. Pat. No. 4,314,022, discloses etchant solutions particularly useful in the practice of the present invention.

The dispersion layer used in the practice of the present invention comprises a layer of from at least 15 or 25 Angstroms to $5 \times 10^4$ Angstroms in thickness. This layer, hereinafter referred to as the opaque or opacifying layer, may, for example, comprise a homogeneous, metal/(metal oxide or sulfide) dispersed composition or a graded composition having variations in the relative proportions of metal to metal oxide or metal sulfide incrementally or with sharp lines of demarcation across general dimensions in the thickness of the layer. The graded layer may be essentially pure metal on one side and nearly pure metal oxide or metal sulfide on the other as long as the minimum optical density is provided, but may also be a dispersed mixture of metal and metal oxide or sulfide on both sides with varying proportions therebetween. If there is no visually discernible variation between one side of the disposed layer and the other, the substrate should provide a contrast between imaged and non-imaged areas and development should etch entirely through the opaque layer. The opaque layer is capable of providing optical densities in excess of 4, but may also provide translucent layers having yellow, gold, tan, grey, black or blue/black coloration therein. The graded opaque layer in its preferred embodiment is characterised by having a transition region wherein the ratio of (metal oxide or metal sulfide)/metal incrementally varies by at least 10 percent over a distance in the thickness of not less than 15 angstroms. This transition is approximately continuous and the transition occurs in a continuous fashion without a sharp demarcation of zones which would cause poor adhesion between those zones. For example, a 50% change of proportions over 5 Angstroms is not continuous. This term is well understood in the art. This continuous gradation can be produced by vapor deposition of metal and metal oxide in such a fashion that greater or lesser proportions of metal are first deposited upon the substrate and increasing, decreasing or varying proportions of metal oxide or metal sulfide are deposited on the upper surface of the opaque layer. A convenient process for effecting manufacture of this layer is shown in Example 1 and taught in assignee's co-pending application U.S. Ser. No. 231,500, filed Feb. 4, 1981 the same day as this application, in the name of Crawford, Downing, and Schlemmer, and now U.S. Pat. No. 4,364,995. Essentially any metal may be used in the formation of the opaque layer. Generally preferred metals include aluminum, tin, zinc, chromium, titanium, silver, magnesium, manganese, iron, and the like. Mixtures of these metals may also be used in the practice of the present invention.

The metal/(metal oxide or sulfide) layer may be readily produced on the apparatus disclosed in said copending process application or by simple modification of existing metal vapor deposition apparatus.

The opacifying layers of the present invention may also be made by other prior art techniques and combinations of known techniques. For example, the sputtering of Al—Al$_2$O$_3$ films onto substrates is known to produce both homogeneous and graded films ("Electrical and Structural Properties of Amorphous Metal-Metal Oxide Systems," J. J. Hauser, *Physical Review*, vol. 7, no. 9, pp. 4099–4104, May 1, 1973) and the oxidation of evaporated aluminum before it impacts the substrate can produce dispersions of metal and metal oxides with either oxygen ("Electrical Properties of Evaporated Aluminum Oxide Films," E. M. DaSilva and P. White, *J. Electrochemical Soc.*, vol. 109, no. 1, pp. 12–15, Jan. 1962) or water vapor ("Aluminum Oxide Fims from the Reaction of Aluminum and Water Vapor," L. H. Kaplan, *Electrochemical Technology* vol. 3, no. 11–12, pp. 335–337, November–December 1965). By using these two oxidizing techniques, that is oxidation of the metal vapor stream itself with an amount of oxidizing agent insufficient to convert all of the evaporated metal to its metal oxide, with a belt carrying the substrate to be coated, a continuous process may be performed. Where two separate coating layers are desired in the final product, as where the opacifying layer is on the surface of an aluminized substrate, the coating may be performed essentially in a single piece of apparatus such as that shown in U.S. Pat. No. 3,962,488, or with modification of the source of the metal or the oxidizing agent in the manner shown by DaSilva et al, or Kaplan. Two separate sources, one supplying metal and the other supplying metal oxide, may also be used to provide a dispersed layer. For purposes of speed and convenience, continuous partial oxidation of the metal vapor stream in apparatus like that of DaSilva et al. or Kaplan appears to be preferred.

The use of the opacifying layers of the present invention may provide a number of unique properties and advantages to the imageable systems of the present invention. Excellent control of the opacity can be maintained and aesthetically pleasing images of various coloration without using dyes or other coloring agents can be provided. By controlling the proportions of metal and metal oxides or sulfides, the etching rate of the opacifying layer also may be controlled. As previously mentioned, the adherence to the substrate and to the resist layer can be improved.

With regard to imageable layers having a pure metal such as aluminum as the surface of the substrate or as the lower part of the dispersion layer, additional features are available. The photosensitive side can be readily determined even on transparencies because of the different proportions of materials. One side may be shiny and the other may be black, for example. The graded layer also assists in preventing undercutting of the opacifying layer which can often occur with other substrates. The graded layer appears to enable uniform dissolving of the exposed opacifying layer and good clean-out of that layer in both a halftone and line image.

The apparatus of the above-identified copending application may be so operated that the reactive gas or vapor (oxygen, sulfur, water, or hydrogen sulfide) is mixed with the metal vapor stream so that a fairly macromolecularly homogeneous metal/(metal oxide or sulfide) composition is deposited onto the substrate. Less than a stoichiometric amount of the reactive gas or vapor should be introduced into the metal vapor stream so that the deposited composition in fact comprises a mixture of oxides and metals which would provide reflective or transmissive optical density on the substrate to be coated. Existing metal vapor deposition apparatus may be modified by providing a reactive gas or vapor inlet means which would inject the reactive gas or vapor (oxygen, sulfur, water or sulfur dioxide) into the metal vapor stream so that the composition of the material being deposited from the vapor phase is a fairly homogeneous or random mixture of metal and metal oxides or sulfides. This would provide a coating on the substrate which is a microscopic dispersion of metal particles in a metal oxide or sulfide phase or a suspension of metal oxide or sulfide particles in a metal phase. Generally 5 or 10 to 98% by weight of the metal present in the layer is in the form of a metal oxide or sulfide. Preferably 25 to 98% of the metal present in the layer is in the form of a metal oxide or sulfide, and most preferably between 50 and 98%. Whatever proportions are selected, for their use in the imaging technology of the present application, the coated substrate should have a reflection or transmission optical density of at least 0.2, values of 0.75, preferably at least 1.0, more preferably at least 2.0, and most preferably at least 2.5, 3.0 or higher can also be obtained. Transmission optical densities of 4.0 have been achieved with the metal/(metal oxide or sulfide) layers herein described.

All of the opacifying layers of the present invention may be characterized by their microscopic internal structure of metal and metal oxide phases and particles. It is in fact this molecular inhomogeneity which tends to provide the opacity. The homogenous layer is properly termed homogeneous because there may be no significant (less than 10%) variation in the relative proportions of metal and metal oxides and sulfides at different points in the horizontal and/or vertical directions within the layer. This layer can also be said to be vertically isotropic.

In the use of homogenous opacifying layers for imaging constructions, it is generally desirable to have the imaging development process etch through the entirety of the opacifying layer exposed by removal of the light sensitive layer in order to expose the supporting substrate, which may be transparent, white, colored, etc.

These and other aspects of the present invention will be presented in the following example. All proportions are in weight percent unless otherwise stated.

EXAMPLE 1

A suitable vapor coating of aluminum metal and aluminum oxide on a biaxially oriented polyester substrate was obtained by the following method.

A conventional vacuum vapor-coater having two resistance heaters located 12 inches (30.5 cm) below the conveyor belt (web) was modified to include an oxygen bleeder tube and a baffle. The oxygen bleeder tube and a vertical baffle was of a length greater than the width of the web and the tube was situated parallel to the plane of the web moved directly above the center of each of the resistance heaters and 7 inches (15.8 cm) below the web. The oxygen bleeder tube had fifty holes which were equally-spaced along its length and which were located only on the side of the tube facing the web. The baffle was of a length of sixteen inches (40.6 cm) and was situated perpendicular to the direction in which the web moves and extended from 2 inches (5.08 cm) below the web to 3 inches (7.62 cm) below the oxygen bleeder tube, passing beyond the tube and into contact with the upstream side of that tube so as to form a barrier preventing passing of the oxygen to the other side of the baffle.

The above-described vacuum vapor-coater was pumped down to a pressure of 0.2 microns (of mercury) and while the horizontal baffle was closed the resistance heaters were brought to a temperature sufficient to vaporize aluminum wire. Aluminum wire (1/16 inch thick) was then supplied to the resistance heaters. This permitted deposition of an aluminum metal vapor coating having a resistivity of 0.3 to 0.5 ohms/square when the web was moving at 20 to 25 feet (6.3 to 7.9 m) per minute. Concomitant with the heating of the resistance heaters and the feeding of the wire as described above, the pressure within the vapor-coater increased to about 0.5 microns. Oxygen was fed simultaneously into the vapor-coater through the oxygen bleeder tube at a rate less than stoichoimetric equivalence which maintained the pressure within the vapor-coater approximately constant at about 0.5 microns. With the web moving at the above indicated rate and using a 0.004 inch-thick ($1.02 \times 10^{-4}$ m) film of polyethylene terephthalate as the substrate, a vapor coating was obtained which was shiny silver in appearance when viewed from the backside, namely through the polyester film (indicating essentially pure aluminum adjacent the polyester), and which was dark blue-black in appearance when viewed from the front-side indicating that a mixture of metal and metal oxide was present. The optical density of the vapor coating was 3.67. The coating directly in contact with the film was essentially pure aluminum and gradually the composition had more and more alumina towards the surface of the coated article.

The above vapor-coated substrate was suitable for employment as a substrate for a photographic resist imaging system. The substrate provided good binding capability for photoresist coatings which were applied thereto.

EXAMPLE 2

A negative-acting photosensitive composition was formed by mixing the following ingredients, 40 parts by weight of 1,3-bis[3-(2-acryloyloxyethoxy)-2-hydroxypropyl]-5,5-dimethyl-2,4-imidizolodinedione, 5 parts of diallyl orthophthalate prepolymer, 11 parts of a vinyl chloride-vinyl acetate (86/14) copolymer, 2 parts of a butylmethacrylic acid-methylacrylic acid copolymer, 4 parts of diphenyliodonium hexafluorophosphate photoinitiator, and 2 parts of a sensitizer, Michlers ketone.

This composition was coated onto the graded aluminum/aluminum oxide layer of Example 1 with a wire wound Meyer bar and dried for 4 minutes at 94° C. to form about a 10 micron dry coating. The dried coating was exposed through a ten-step graphic arts tablet by means of a two kilowatt ultraviolet radiation source for five seconds at a distance of one meter. After exposure, a conventional aqueous alkaline developer solution consisting of 1% by weight sodium hydroxide was used to wash away unexposed photopolymerizable materials. The exposed image remained firmly attached to the black layer enabling the photopolymerized image to act as a resist layer while the exposed black areas were etched.

The same composition when adhered to a shiny aluminum substrate was completely removed by the developer after exposure, indicating the improved adherence provided by the black layer.

EXAMPLE 3

A positive acting photoresist composition comprising the composition disclosed in Example 3 of U.S. patent application Ser. No. 60,601 filed July 27, 1979 now U.S. Pat. No. 4,247,616 (and Luxembourg Pat. No. 81,652) was coated onto the black substrate of Example 1 and dried at 94° C. to form a 10 micron coating. The photosensitive layer was exposed to ultraviolet radiation from a two kilowatt source through a ten-step graphic arts tablet for fifteen seconds at a distance of one meter. The exposed image was developed in an aqueous solution at 20° C. comprising 17.8 grams sulfonated dodecyl diphenyl ether, and 12.4 grams sodium hydroxide in one liter of solution. A readable black and white image resulted from the development.

EXAMPLE 4

A black opaque metal layer was deposited in the same manner as in Example 1 except that zinc wire was used.

The following negative acting photoresist composition was prepared, with the proportions in parts by weight:
40 parts of Compound A of Example 1 of U.S. patent application Ser. No. 051,876 filed June 25, 1979, now U.S. Pat. No. 4,249,011
5 parts poly allylisopthalate (Dapon ®35),
10 parts (86/14) copolymer of vinyl acetate/vinyl chloride,
1.5 parts (80/20) copolymer n-butyl acrylate/methyl acrylic acid,
2 parts Michler's ketone (sensitizer),
8 parts diphenyliodonium hexafluorophosphate, and Acetone to 1000 parts This photoresist composition was coated at about 15 microns dry thickness onto the opaque zinc layer and air dried at room temperature. The coating was exposed through a ten step graphic arts tablet by a two kilowatt ultraviolet radiation source for two seconds at a distance of one meter. The exposed coating was developed with the solution of Example 3. The exposed areas of the photopolymer layer remained as a film on the opaque zinc and protected the metal layer from the developer. The unexposed photopolymer and the unprotected metal were removed by development as in Example 3 leaving a black metal negative image.

EXAMPLE 5

Example 4 was repeated in its entirety except that tin was used as the metal and the photoresist composition was dried at 60° C. A graphic arts halftone dot pattern comprising dots from 3 to 95% of the surface area was used with a two kilovolt ultraviolet radiation source at a distance of one meter to expose the dried photopolymerizable composition. After development with the developer solution of Example 3, a black metal image of halftone dots was obtained reproducing the 3 to 95% range of the target.

EXAMPLE 6

A homogeneous opacifying layer of aluminum and aluminum oxide on a polyethyleneterephthalate substrate was produced in a manner substantially identical to that of Example 1, except that the baffle plate dividing the metal vapor stream into two portions was removed. The oxygen source was also relocated so that oxygen was fairly evenly dispersed throughout the metal vapor stream in proportions less than that necessary for complete conversion of the aluminum to aluminum oxide ($Al_2O_3$). A black layer (when viewed from either side) was thus deposited on the polyester.

The black layer was overcoated with a solution comprising:
0.14 g 1,3-bis(3[2,2,2-triacryloxymethyl]ethoxy-2-hydroxypropyl)-5,5-dimethyl-2,4-imidolidinedione
0.01 g polyallyl isophthalate
0.03 g (86/14) copolymer of vinyl chloride and vinyl acetate
0.006 g (80/20) copolymer of n-butylmethacrylate and methylmethacrylic acid
0.008 g Michler's Ketone (sensitizer)
0.016 g diphenyliodonium hexafluorophosphate with 10 g of solution completed with 1,1,2-tricholoroethane The solution was coated out and air dried to a thickness of about 15 micrometers. After drying this film was mated with a high contrast halftone negative film and exposed in a vacuum frame for 5 seconds to a 2 kilowatt mercury halide light source 1 meter from the plane of the film. The exposed film was immersed in a 1% solution of sodium hydroxide at 35° C. for 4 minutes with surface agitation. A high contrast black halftone image was visible. The image color was black when viewed from either side.

EXAMPLE 7

An aluminum metal layer of about 600 Å was vacuum vapor deposited onto a 4 mil (102 micron) polyester transparent support. A layer of aluminum/aluminum oxide was vacuum deposited on top of this layer. The technique described by DaSilva et al. in *J. Electrochemical Soc.*, Vol. 109, No. 1, pp. 12-15, January '62, was used for the application of this second layer. By adjusting the amount of oxygen introduced into the aluminum vapor stream this second layer exhibited a black color. A positive acting photoresist layer as in Example 3 was coated over the second layer and dried. The photoresist side of the resulting imaging film was exposed to ultraviolet light from a 2 KW source for 15 seconds at a distance of one meter. The exposed film was developed in an aqueous solution of 1% by weight of sodium hydroxide. A readable image, black on the outer surface but shiny when viewed through the base, was obtained.

EXAMPLE 8

An opaque aluminum layer was deposited onto a 4 mil (102 microns) polyester base in the manner described in Example 7. Also, as in Example 7, a second layer was vapor deposited over the first layer. In this case, however, the oxygen introduced into the aluminum vapor stream was adjusted to convert virtually all of the aluminum to aluminum oxide resulting in a substantially clear layer on the shiny aluminum surface. The film viewed from both sides appeared shiny.

The negative acting photoresist of Example 2 was overcoated onto this metal surface. The dried coating was exposed through a 10 step Graphic Arts sensitivity target by means of a 2 KW ultraviolet source for 5 seconds at a distance of one meter. This film was then developed in 1% sodium hydroxide aqueous solution. After only 15 seconds of development time the resist layer lifted off the metal layer and a substantially inferior image was produced in the metal layer.

EXAMPLE 9

A two layer $Al/Al_2O_3$ film was prepared as in Example 8, but this time the oxygen introduced into the aluminum vapor stream was adjusted to produce a brownish-copper hue when viewed from the front side of the web. Again as in Example 8, the negative-acting photoresist of Example 2 was overcoated onto the brownish layer, exposed in the same manner, and developed in the same solution. A sharp brownish copper colored image was obtained. The importance of the optical density being at least 0.2 in the oxide layer is thus illustrated in comparison of these results with Example 8.

What is claimed is:
1. An imageable article comprising
   (a) a substrate,
   (b) on at least one surface of said substrate a first opacifying layer comprising a dispersion of (i) metal and (ii) metal oxide with an optical density of at least 0.2 derived from the dispersion, and
   (c) a photoresist layer on said first layer, wherein said opacifying layer is at least 15 Angstroms in thickness and comprises a mixture of (a) metal and (b) metal oxide, said opacifying layer characterized by having a region of higher concentration of metal on one surface than on a second surface, and having said one surface of the said opacifying layer bonded to said substrate, having said second surface facing away from said substrate, and having a zone of continuous transition of the concentration of metal from said region of higher concentration of metal to said second surface.
2. The imageable article of claim 1, wherein the same metal comprises said (i) metal and said (ii) metal oxide.
3. The imageable article of claim 1 wherein said photoresist is a negative acting polyethylenically unsaturated photosensitive composition.
4. The imageable article of claim 1 wherein said photoresist comprises a positive acting photoresist composition.
5. The imageable article of claim 4 wherein said metal is selected from the group consisting of aluminum, tin, zinc, chromium, titanium, magnesium, manganese, nickel, iron, and mixtures thereof.

6. The article of claim 1 wherein said photosensitive resist layer is selected from the group consisting of:
   (a) positive acting photoresists comprising a polymeric binding and a positive acting diazonium salt or resin, and
   (b) negative acting photoresists comprising a composition capable of photopolymerizing in an imagewise fashion when irradiated.

7. The article of claim 6 wherein said photosensitive resist layer is a positive acting photoresist comprising a positive acting diazonium salt or resin in an epoxy polymeric binder.

8. The article of claim 1, 6 or 7 wherein the same metal comprises said metal and said metal oxide and said metal is selected from the group consisting of aluminum, tin, zinc, chromium, titanium, magnesium, manganese, nickel, iron and mixtures thereof.

9. The article of claim 1, 6 or 7 wherein the same metal comprises said metal and said metal oxide and that metal comprises aluminum.

* * * * *